FREQUENCY CONVERTER

Filed Feb. 2, 1953 2 Sheets-Sheet 1

INVENTORS
EDWARD CHATTERTON JR.
JOSEPH T. BEARDWOOD III
BY
Brown, Denk & Synnestvedt
AGENTS Dec. 11, 1956 E. CHATTERTON, JR., ET AL 2,773,979

FREQUENCY CONVERTER

Filed Feb. 2, 1953 2 Sheets-Sheet 2

INVENTORS
EDWARD CHATTERTON JR.
JOSEPH T. BEARDWOOD III
BY
Brown, Denk & Synnestvedt
AGENTS 2,773,979
Patented Dec. 11, 1956

2,773,979

FREQUENCY CONVERTER

Edward Chatterton, Jr., and Joseph T. Beardwood III, Philadelphia, Pa., assignors to Philco Corporation, Philadelphia, Pa., a corporation of Pennsylvania Application February 2, 1953, Serial No. 334,436

3 Claims. (Cl. 250—20)

This invention relates to frequency converters, and more particularly to frequency converters for use in superheterodyne radio wave receivers operating in the very high and ultrahigh frequency bands.

It is well known that the ultrahigh frequency band, and at least the upper portion of the very high frequency band, are characterized by an almost complete absence of atmospheric noise or static. This being so, the maximum sensitivity of a receiver operating in these regions of the radio wave spectrum is limited primarily by the noise level in the early stages of the receiver. In a superheterodyne receiver incorporating relatively low noise circuits in thet first and second intermediate frequency amplifier stages, the noise level at the output is determined largely by the noise generated in the frequency converter. Therefore any reduction in the noise generated in the frequency converter or, more generally, any increase in the signal-to-noise ratio at the output of the frequency converter, will contribute directly to increasing the maximum sensitivity of the receiver. The relative merits of frequency converters operating in the very high frequency range and above is expressed in terms of the noise figure F of the converter. The noise figure may be expressed as the product of the conversion loss $L_x$ and the noise temperature $t_x$ of the mixer forming a part of the frequency converter. The conversion loss $L_x$ is the ratio of output signal power at the intermediate frequency to the input signal power, and is generally less than unity for diode mixers. The noise temperature $t_x$ is the ratio of the temperature in degrees K, to which a resistor having the same impedance as the mixer circuit would have to be raised in order to produce the same amount of noise power as that generated in the mixer, to a standard temperature of 290° K. In a crystal mixer the noise temperature is a function of the instantaneous voltage applied to the crystal.

The copending application of Claudius T. McCoy and Edward Chatterton, Jr., Serial No. 334,124, filed January 30, 1953, which is assigned to the assignee of the present invention, describes and claims a frequency converter system which has a relatively low noise figure, this low noise figure being achieved by employing a local oscillator signal having relatively high, narrow positive peaks and relatively low, broad negative peaks. As pointed out in the above-mentioned copending application, a preferred method of achieving this characteristic for a local oscillator signal lying in the microwave region is by harmonic reinforcement of the normally sinusoidal local oscillator signal. However, we have discovered that the desired asymmetrical local oscillator signal can be generated at frequencies below the microwave regions in other and simpler systems.

Therefore it is an object of the present invention to provide a novel frequency converter, employing lumped parameter circuits, which has a relatively low noise figure.

It is a further object of the present invention to provide a simple, novel, U. H. F.–V. H. F. frequency converter which has a relatively low noise figure.

It is a further object of the present invention to provide a novel circuit for impressing an asymmetrical local oscillator signal on the mixer crystal forming a part of a frequency converter.

Still another object of the present invention is to provide a mixer circuit including new and improved means for imparting an optimum waveform to the local oscillator signal.

These and other objects of the present invention which will become apparent as the description of the invention proceeds are generally accomplished by injecting a substantially sinusoidal local oscillator signal into a circuit employing a clipping element in series with a load impedance. This load impedance is also connected in circuit with the mixer element so as to serve as a source of asymmetrical local oscillator signal for the mixer element. The circuit includes means for isolating the radio wave signal and the intermediate frequency signal from the clipping element.

For a better understanding of the invention together with other and further objects thereof, reference should now be made to the following detailed description which is to be read in conjunction with the accompanying drawings in which.

Figure 1:
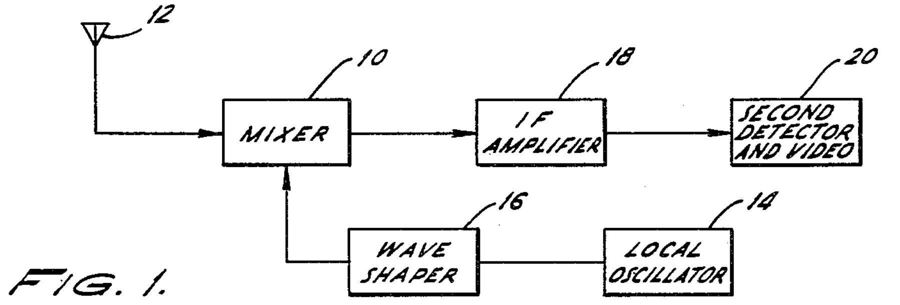
Fig. 1 is a block diagram of a typical radio wave receiver embodying the teachings of the present invention.

In Fig. 1 the signal to be heterodyned is applied to a mixer 10 which is preferably of the diode crystal type. An antenna 12 is shown as a source of the signal in Fig. 1 although it is to be understood that, in other applications of the present invention, the signal to be heterodyned may be supplied from other sources. This signal may be a single frequency signal or a signal having several closely spaced frequency components such as are found in an amplitude modulated radio wave signal. A local oscillator 14 provides a substantially sinusoidal signal at a frequency differing from the frequency of the incoming signal by the desired intermediate frequency. Throughout the specification and claims the term intermediate frequency signal is used to describe the desired heterodyne signal which may have a single frequency or a group of frequencies depending upon the nature of the signals supplied to the frequency converter. A waveshaper 16 converts the sinusoidal local oscillator signal to an asymmetrical signal having relatively high, narrow, positive peaks and relatively low, broad, negative peaks. The fundamental frequency of the asymmetrical signal is equal to that of the sinusoidal local oscillator signal. The asymmetrical signal from waveshaper 16 is supplied to mixer 10 where it is combined with the incoming signal from antenna 12 to provide the intermediate frequency which is supplied to intermediate frequency amplifier 18. The output of intermediate frequency amplifier 18 may be supplied to a second detector and video amplifier 20 in the usual fashion. The system described above is disclosed and claimed in the above-identified copending application.

Figure 2:
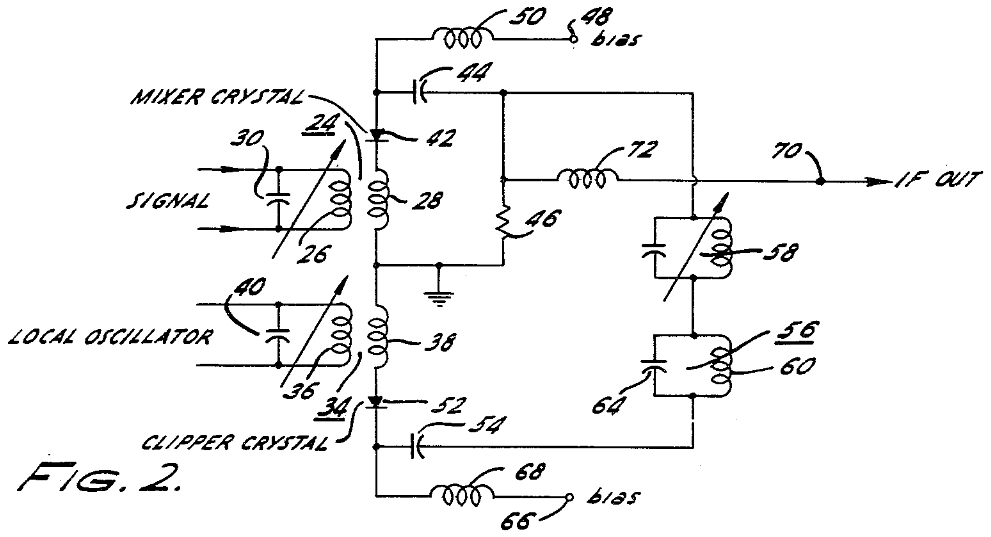
Fig. 2 is a schematic diagram of the preferred embodiment of the present invention which corresponds generally to the waveshaper-mixer portion of the block diagram of Fig. 1.

Fig. 2 illustrates in detail the novel mixer-waveshaper combination which comprises the present invention. In Fig. 2 the incoming signal from antenna 12 in Fig. 1 is supplied to a tuned transformer 24 which as shown comprises primary winding 26, secondary winding 28 and capacitor 30 in shunt with winding 26. All or part of capacitor 30 may be made up of stray capacitance in windings 26 and 28. Transformer 24 may be either capacitively or inductively tuned. A local oscillator signal is supplied to a second transformer 34 which also includes a primary winding 36, a secondary winding 38 and a capacitor 40 in shunt with primary winding 36. It will become apparent as the description of the invention proceeds that double-tuned transformers or other forms of coupling circuits may be substituted for transformers 24 and 34 without departing from the present invention. As shown in Fig. 2, each of the windings 28 and 38 has one terminal thereof connected to a point of reference potential indicated by the ground symbol. A diode mixer crystal 42 is connected to the ungrounded terminal of secondary winding 28. The terminal of crystal 42 remote from winding 28 is connected through a D. C. blocking capacitor 44 to one end of a load resistor 46. Capacitor 44 is preferably an effective short circuit at the intermediate and higher frequencies. The value of resistor 46 is not critical but it should be small compared to the average resistance of crystal 42. Also, as will be brought out presently, resistor 46 forms a part of the grid circuit of the first intermediate frequency amplifier stage, and therefore should be selected to minimize the noise generated in that stage. Crystal 42 is biased to an optimum operating point by a bias potential supplied to terminal 48. A choke 50 is provided for isolating the bias source from intermediate and radio frequency signals.

A second diode element, shown in Fig. 2 as a crystal 52, is connected in series with the ungrounded terminal of secondary winding 38. A second terminal of crystal 52 is connected through D.-C. blocking capacitor 54, intermediate frequency trap 56 and signal trap 58 to the ungrounded end of load resistor 46. Intermediate frequency trap 56 as shown comprises an inductor 60 in parallel with a capacitor 64. This parallel combination is resonant, and therefore presents a high series impedance at the intermediate frequency of the system. This trap need not be tunable since a radio wave receiver normally operates with a fixed intermediate frequency. As mentioned above in connection with transformers 24 and 34, all or part of capacitor 64 may consist of stray capacitances of the inductor 60. Since the function of trap 56 is to prevent the circulation of intermediate frequency signals in the series circuit comprising secondary winding 38, crystal 52 and load resistor 46, it is obvious that other forms of signal traps may be substituted for trap 56 without departing from the invention. Signal trap 58 is similar to intermediate frequency trap 56 except that it is tunable, either inductively or capacitively, to the frequency of the incoming signal. Crystal 52 is supplied with appropriate bias by a source connected to terminal 66. A choke 68 is provided for isolating the bias source connected to terminal 66 from the intermediate and signal frequencies present at the junction of the capacitor 54 and crystal 52. An output terminal 70 is connected to the ungrounded end of load resistor 46 through a series inductor 72 which blocks the passage of radio frequencies while allowing the intermediate frequency signals to pass to terminal 70. Terminal 70 is connected to the grid or other control element of the first intermediate frequency amplifier stage of the radio wave receiver. If the frequency converter shown in Fig. 2 is employed in a system other than a radio wave receiver, terminal 70 is connected to the appropriate utilization circuit for the heterodyned signal.

Figure 3:
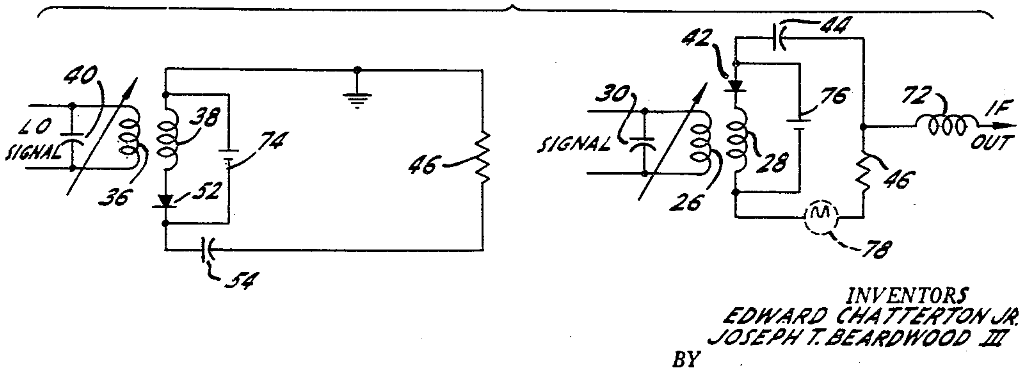
Figs. 3A and 3B are equivalent circuits of the system of Fig. 2 for signal and local oscillator frequencies, respectively.

Fig. 3A is an equivalent circuit of Fig. 2 as seen by the local oscillator signal. Parts in Fig. 3A corresponding to like parts in Fig. 2 have been given the same reference numeral. The bias source for crystal 52 is shown as battery 74 in Fig. 3A and choke 68 has been omitted in the interest of simplifying the drawings. Fig. 3B is an equivalent circuit of Fig. 2 as seen by the signal to be heterodyned. Circuit elements in Fig. 3B corresponding to similar circuit elements of Fig. 2 bear the same reference numerals. Again the bias source for crystal 42 has been illustrated as a battery 76, and choke 50 has been omitted. Asymmetrical signal source 78 shown in phantom in Fig. 3B, represents the asymmetrical signal generated across resistor 46 by the circuit of Fig. 3A.

Figure 4:
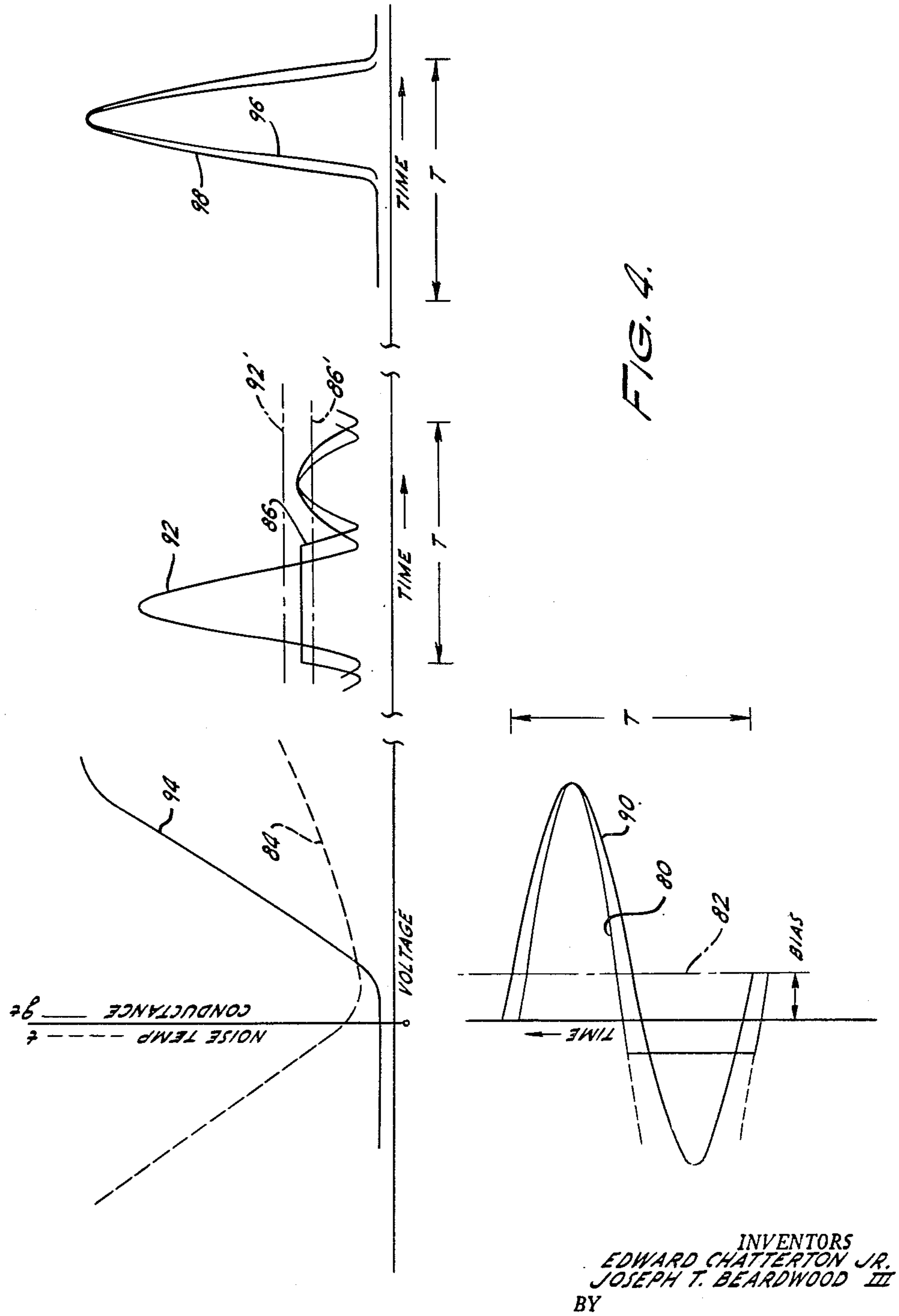
Fig. 4 is a series of waveforms illustrative of the operation of the system of Fig. 2.

The embodiment of the invention illustrated in Fig. 2 operates in the following manner. The sinusoidal local oscillator signal supplied to the primary winding 36 of transformer 34 is transferred to secondary winding 38 in the usual manner. This sinusoidal signal is partially clipped by crystal 52. The clipped waveform appears across resistor 46. The level at which the local oscillator signal is clipped by crystal 52 is determined by the bias supplied at terminal 66. It is believed that optimum operation in accordance with the invention is achieved when crystal 52 is biased in the forward direction so that it conducts for more than half of each cycle of the signal supplied to winding 36. This condition is illustrated by waveform 80 in Fig. 4. The broken line 82 in Fig. 4 represents the D.-C. average value of waveform 80, and the distance from line 82 to the clipped negative portion of waveform 80 represents the bias supplied at terminal 66. Since resistor 46 has a resistance much lower than the average resistance of crystal 42, it acts as a generator supplying the asymmetrical signal shown at 80 in the Fig. 4 to crystal 42. The distance from line 82 to the axis represents the bias potential supplied at terminal 48. The magnitude of this bias potential will depend upon the particular operating characteristics of crystal 42. The signal to be heterodyned is supplied to crystal 42 by transformer 24. The nonlinear characteristic of crystal 42 produces a heterodyning of the two signals simultaneously supplied thereto. This heterodyning process, which is the same as that encountered in conventional mixer circuits, results in the generation of an intermediate frequency signal which appears across resistor 46. Both the intermediate frequency signal and the incoming signal supplied by transformer 24 are constrained to the series loop comprising secondary winding 28, crystal 42 and load resistor 46 by the high series impedances of I. F. trap 56 and signal trap 58. By constraining the I. F. and signal frequencies to this series loop, losses are eliminated which would result if these signals were allowed to be impressed on clipper crystal 52.

The advantages of the circuit shown in Fig. 2 over prior art circuits employing sinusoidal local oscillator signals is best understood by reference to the waveforms of Fig. 4. Curve 84 in Fig. 4 shows the relationship between instantaneous noise temperature and instantaneous applied voltage for a typical mixer crystal. It will be seen that this curve has a minimum point in the positive region slightly to the right of the zero axis. This curve also shows that the noise temperature of the crystal, and hence the noise power generated therein, is much higher for negative potentials applied to the crystal than it is for corresponding positive potentials. The application of the waveform shown at 80 in Fig. 4, to a crystal having the noise characteristic represented by curve 84, results in the variation of the noise temperature output with time as shown by waveform 86. The average value of waveform 86, represented by the broken line 86' is the effective output noise power of the crystal 42.

A typical sinusoidal local oscillator signal waveform 90 is plotted on the same time scale as asymmetrical local oscillator signal waveform 80. The bias applied to terminal 48 is assumed to be the same as before, and waveform 90 is chosen to have a peak amplitude corresponding to that of waveform 80. The instantaneous noise temperature variation of the crystal having the characteristic shown at 84, resulting from the application of sinusoidal waveform 90, is shown by waveform 92 in Fig. 4. It will be noted that waveform 92 has a relatively high peak caused by the negative peak of waveform 90. It will also be noted that the average value of waveform 92 as shown by the broken line 92' is considerably higher than the average value of waveform 86. Since the noise figure of the converter is dependent upon the noise temperature of the crystal, it is clear that a crystal supplied with the asymmetrical waveform 80 in accordance with the teachings of the present invention will have a noise figure considerably lower than the same crystal supplied with a conventional waveform shown at 90.

As mentioned above, the noise figure of a converter depends not only upon the noise temperature of the crystal but also on the conversion loss. It can be shown that the conversion loss $L_x$ of a crystal is given by the expression:

$$L_x=\frac{4\left(g_a+\sqrt{g_a^2-\frac{g_f^2}{4}}\right)^2}{g_f^2}$$

where $g_a$ is the average value of the conductance waveform and $g_f$ is the fundamental Fourier component of the conductance waveform. It can be seen from this equation that the conversion loss decreases rapidly as the ratio $g_f/g_a$ increases. It is well known that this ratio increases as the waveform of a function approaches a spike function. Turning once again to Fig. 4, curve 94 represents the conductance versus applied voltage characteristic of a typical crystal. The conductance versus time relationship obtained by the application of a waveform 80, as taught by the present invention, is shown by waveform 96. The conductance versus time relationship resulting from the application of symmetrical signal 90 is shown by waveform 98. As shown in Fig. 4, waveform 96 has a narrower positive peak than waveform 98 and therefore has a higher ratio of average conductance to the fundamental Fourier component of the conductance waveform. Therefore the application of the asymmetrical signal 80 to the mixer crystal 42, in the manner disclosed herein, reduces both noise temperature and the conversion loss of the crystal, and decreases the noise figure of the converter by the product of these two improvements. It should be remembered that the improvement obtained by employing the asymmetrical waveform local oscillator signal is in addition to any reduction in noise figure which may be obtained by improving the noise figure of the crystal 42 or of other circuits associated with the circuit shown in Fig. 2.

It has been assumed in the above description that diode elements 42 and 52 are crystal elements. Crystal mixers have an inherent noise figure much lower than equivalent diode vacuum tube mixers, and therefore it is believed that element 42 at least should be a crystal diode rather than a vacuum tube diode. However, it is possible that a vacuum tube diode could be substituted for clipper crystal 52 without seriously increasing the noise figure of the converter. If the incoming signal has fixed frequency, transformers 24 and 34 and choke 58 need not be tunable. These changes are but obvious modifications of the preferred embodiment shown in Fig. 2. It will be obvious that other modifications may be made in the preferred embodiments of the invention described and shown herein that fall clearly within the spirit and scope of the hereinafter appended claims.

What is claimed is:

1. A low noise figure heterodyne frequency converter comprising a first transformer having at least a primary winding and a secondary winding, said primary winding being arranged to receive a signal to be heterodyned, a load resistor, a blocking capacitor and a mixer crystal, said three last-mentioned elements being connected in series circuit in the order recited, said load resistor having a resistance small compared to the average impedance of said mixer crystal at the frequency of the local oscillator signal supplied to said frequency converter, said secondary winding being connected at the two ends thereof to the two end terminals of said series circuit to form a closed series loop, a source of bias potential for said mixer crystal, means connecting said source of bias potential between the junction of said mixer crystal and said blocking capacitor in said series circuit and the junction of said load resistor and said secondary winding of said first transformer, a second transformer having at least a primary winding and a secondary winding, said primary winding of said second transformer being arranged to receive a substantially sinusoidal local oscillator signal, one terminal of said secondary winding of said second transformer being connected to the junction of said secondary winding of said first transformer and said load resistor, a clipper crystal, a second blocking capacitor and signal blocking means, said three last-mentioned elements being connected in a second series circuit, said clipper crystal occupying an end position in said second series circuit, the end terminal of said second series circuit adjacent said clipper crystal being connected to a second terminal of said secondary winding of said second transformer and the other end terminal of said second series circuit being connected to the junction of said load resistor and said first-mentioned blocking capacitor, said signal blocking means including means offering a high series impedance at the frequency of the signal to be heterodyned and at the intermediate frequency, a source of bias potential for said clipper crystal, means connecting said last-mentioned source between the terminal of said clipper crystal remote from said secondary winding of said second transformer and the junction of said load resistor and said secondary winding of said first transformer, the amplitude and polarity of the bias supplied by said last-mentioned source being such as to cause a selected portion of the negative half cycle of the local oscillator signal supplied to said load resistor to be clipped, said selected portion being less than the entire negative half cycle, and signal coupling means associated with said load resistor for coupling an intermediate frequency signal from said converter.

2. A low noise figure heterodyne frequency converter comprising a first transformer having at least a primary winding and a secondary winding, said primary winding being arranged to receive a signal to be heterodyned, a load impedance, a blocking capacitor and a mixer element, said three last-mentioned elements being connected in series circuit in the order recited, said load impedance having an impedance small compared to the average impedance of said mixer element at the frequency of the local oscillator signal supplied to said frequency converter, said secondary winding being connected at the two ends thereof to the two end terminals of said series circuit to form a closed series loop, a source of bias potential for said mixer element, means connecting said source of bias potential between the junction of said mixer element and said blocking capacitor in said series circuit and the junction of said load impedance and said secondary winding of said first transformer, a second transformer having at least a primary winding and a secondary winding, said primary winding of said second transformer being arranged to receive a substantially sinusoidal local oscillator signal, one terminal of said secondary winding of said second transformer being connected to the junction of said secondary winding of said first transformer and said load impedance, a clipper element, a second blocking capacitor and signal blocking means, said three last-mentioned elements being connected in a second series circuit, said clipper element occupying an end position in said second series circuit, the end terminal of said second series circuit adjacent said clipper element being connected to a second terminal of said secondary winding of said second transformer and the other end terminal of said second series circuit being connected to the junction of said load impedance and said first-mentioned blocking capacitor, said signal blocking means including means offering a high series impedance at the frequency of the signal to be heterodyned and at the intermediate frequency, a source of bias potential for said clipper element, means connecting said last-mentioned source between the terminal of said clipper element remote from said secondary winding of said second transformer and the junction of said load impedance and said secondary winding of said first transformer, the bias supplied by said last-mentioned source being such as to cause a selected portion of the negative half cycle of the local oscillator signal supplied to said load impedance to be clipped, and signal coupling means associated with said load impedance for coupling an intermediate frequency signal from said converter.

3. A low noise figure heterodyne frequency converter comprising a first signal coupling impedance having first and second terminals, means associated with said signal coupling impedance for causing the signal to be heterodyned to appear thereacross, a load impedance, a blocking capacitor and a mixer element, said three last-mentioned elements being connected in series circuit in the order recited, said load impedance having an impedance small compared to the average impedance of said mixer element at the frequency of the local oscillator signal supplied to said frequency converter, said first signal coupling impedance being connected at the two ends thereof to the two end terminals of said series circuit to form a closed series loop, a source of bias potential for said mixer element, means connecting said source of bias potential to said series circuit to bias said mixer element, a second signal coupling impedance having first and second terminals, means associated with said second signal coupling impedance for causing a substantially sinusoidal local oscillator signal to appear thereacross, one terminal of said second signal coupling impedance being connected to the junction of said first signal coupling impedance and said load impedance, a clipper element, a second blocking capacitor and signal blocking means, said three last-mentioned elements being connected in a second series circuit, said clipper element occupying an end position in said second series circuit, the end terminal of said second series circuit adjacent said clipper element being connected to a second terminal of said second signal coupling impedance and the other end terminal of said second series circuit being connected to the junction of said load impedance and said first-mentioned blocking capacitor, said signal blocking means including means offering a high series impedance at the frequency of the signal to be heterodyned and at the intermediate frequency, a source of bias potential for said clipper element, means connecting said last-mentioned source to said second series circuit to bias said clipper element in a forward direction, the bias supplied by said last-mentioned source being such as to cause a selected portion of the negative half cycle of the local oscillator signal supplied to said load impedance to be clipped, and signal coupling means associated with said load impedance for coupling an intermediate frequency signal from said converter.

References Cited in the file of this patent

UNITED STATES PATENTS

| | | |
|---|---|---|
| 2,171,154 | Wright | Aug. 29, 1939 |
| 2,266,670 | Winfield | Dec. 16, 1941 |
| 2,596,117 | Bell et al. | May 13, 1952 |
| 2,617,016 | Knol et al. | Nov. 4, 1952 |
| 2,621,289 | Gray | Dec. 9, 1952 |

OTHER REFERENCES

Miller: Noise Spectrum of Crystal Rectifiers, Proc. I. R. E., vol. 35, No. 3 (March 1947), pp. 252 to 256.